United States Patent
Evans et al.

(10) Patent No.: US 10,690,821 B1
(45) Date of Patent: Jun. 23, 2020

(54) METHODS OF PRODUCING SLANTED GRATINGS

(71) Applicant: APPLIED Materials, Inc., Santa Clara, CA (US)

(72) Inventors: Morgan Evans, Manchester, MA (US); Rutger Meyer Timmerman Thijssen, Sunnyvale, CA (US); Megan Clark, Gloucester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/297,981

(22) Filed: Mar. 11, 2019

Related U.S. Application Data

(60) Provisional application No. 62/780,138, filed on Dec. 14, 2018.

(51) Int. Cl.
| | |
|---|---|
| *G02B 5/18* | (2006.01) |
| *H01L 21/02* | (2006.01) |
| *H01L 21/3065* | (2006.01) |
| *H01L 21/3213* | (2006.01) |
| *H01J 37/305* | (2006.01) |
| *H01L 21/311* | (2006.01) |

(52) U.S. Cl.
CPC ......... *G02B 5/1857* (2013.01); *G02B 5/1842* (2013.01); *H01J 37/3053* (2013.01); *H01L 21/02164* (2013.01); *H01L 21/3065* (2013.01); *H01L 21/31105* (2013.01); *H01L 21/32136* (2013.01)

(58) Field of Classification Search
CPC ................ G02B 5/1857; G02B 5/1842; H01L 21/31105; H01L 21/32136; H01L 21/02164; H01L 21/3065; H01J 37/3053
See application file for complete search history.

(56) References Cited

U.S. PATENT DOCUMENTS

| | | | |
|---|---|---|---|
| 5,283,690 A | * | 2/1994 | Miyake ................ G02B 5/1814 359/566 |
| 10,274,678 B1 | * | 4/2019 | Liu ................... H01L 21/30608 |
| 2004/0013076 A1 | | 1/2004 | Funato et al. |

(Continued)

FOREIGN PATENT DOCUMENTS

| | | |
|---|---|---|
| JP | 06-053600 A | 2/1994 |
| JP | 2000-193813 A | 7/2000 |
| WO | 2020018270 A1 | 1/2020 |

OTHER PUBLICATIONS

International Search Report for Sainiemi dated Feb. 21, 2020, 3 pages.

(Continued)

*Primary Examiner* — Duy Vu N Deo

(57) ABSTRACT

Methods of producing gratings with trenches having variable height and width are provided. In one example, a method includes providing an optical grating layer atop a substrate, and providing a patterned hardmask over the optical grating layer. The method may include forming a mask over just a portion of the optical grating layer and the patterned hardmask, and etching a plurality of trenches into the optical grating layer to form an optical grating. After trench formation, at least one of the following grating characteristics varies between one or more trenches of the plurality of trenches: a trench depth and a trench width.

20 Claims, 9 Drawing Sheets

(56) References Cited

U.S. PATENT DOCUMENTS

| | | |
|---|---|---|
| 2009/0263733 A1 | 10/2009 | Nomura |
| 2016/0033697 A1 | 2/2016 | Sainiemi et al. |
| 2016/0033784 A1* | 2/2016 | Levola .............. G02B 27/4205 385/37 |
| 2020/0124865 A1 | 4/2020 | Thijssen et al. |

OTHER PUBLICATIONS

Written Opinion for PCT/US2019/059059 dated Feb. 21, 2020, 5 pages.
https://www.micro-resist.de/en/application/inkjet-printing; 4 pages.

* cited by examiner

METHODS OF PRODUCING SLANTED GRATINGS

CROSS-REFERENCE TO RELATED APPLICATIONS

This application claims priority to U.S. provisional patent application Ser. No. 62/780,138, filed Dec. 14, 2018, the entire contents of which is incorporated by reference herein.

FIELD OF THE DISCLOSURE

Embodiments of the present disclosure generally relate to methods of producing gratings. More specifically, the disclosure relates to methods of producing gratings with trenches having variable height and width.

BACKGROUND OF THE DISCLOSURE

Optical elements such as optical lenses have long been used to manipulate light for various advantages. Recently, micro-diffraction gratings have been utilized in holographic and augmented/virtual reality (AR and VR) devices. One particular AR and VR device is a wearable display system, such as a headset, arranged to display an image within a short distance from a human eye. Such wearable headsets are sometimes referred to as head mounted displays, and are provided with a frame displaying an image within a few centimeters of the user's eyes. The image can be a computer-generated image on a display, such as a micro display. The optical components are arranged to transport light of the desired image, where the light is generated on the display to the user's eye to make the image visible to the user. The display where the image is generated can form part of a light engine, so the image generates collimated light beams guided by the optical component to provide an image visible to the user.

Different kinds of optical components have been used to convey the image from the display to the human eye. To properly function in an augmented reality lens or combiner, the geometries of an optical grating may be designed to achieve various effects. In some devices, multiple different regions, such as two or more different regions, are formed on the surface of a lens, wherein the grating geometries in one region are different from the grating geometries in other regions.

Angled surface relief optical gratings can be produced by the direct etching of angled trenches into a substrate or a film stack on a substrate. One of the parameters controlling the efficiency of the optical grating is the trench depth. Unfortunately, current approaches of forming optical gratings with varied heights, widths, and/or shapes across diffracting and viewing fields have proved challenging.

Therefore, there is a need for improved methods of producing gratings having trenches with variable height and width.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

Embodiments of the present disclosure provide a method of forming a diffracted optical element, the method including providing an optical grating layer atop a substrate, providing a patterned hardmask over the optical grating layer, and forming a mask over just a portion of the optical grating layer and the patterned hardmask. The method may further include etching a plurality of trenches into the optical grating layer to form an optical grating, wherein a first depth of a first trench of the plurality of trenches is different than a second depth of a second trench of the plurality of trenches.

Embodiments of the present disclosure further provide a method of forming an optical grating component, the method including providing an optical grating layer atop a substrate, and providing a patterned hardmask over the optical grating layer. The method may further include forming a mask over just a portion of the optical grating layer and the patterned hardmask. The method may further include etching a plurality of trenches into the optical grating layer to form an optical grating, wherein at least one of the following grating characteristics varies between one or more trenches of the plurality of trenches: a trench depth and a trench width.

Embodiments of the present disclosure further provide a method of forming an optical grating component, the method including providing an optical grating layer atop a substrate, and providing a patterned hardmask over the optical grating layer. The method may further include forming a mask over just a portion of the optical grating layer and the patterned hardmask. The method may further include forming a plurality of trenches in the optical grating layer by etching the optical grating layer, the patterned hardmask, and the mask, wherein at least one of the following grating characteristics varies between one or more trenches of the plurality of trenches: a trench depth and a trench width.

BRIEF DESCRIPTION OF THE DRAWINGS

The accompanying drawings illustrate exemplary approaches of the disclosure, including the practical application of the principles thereof, as follows.

Figure 1:
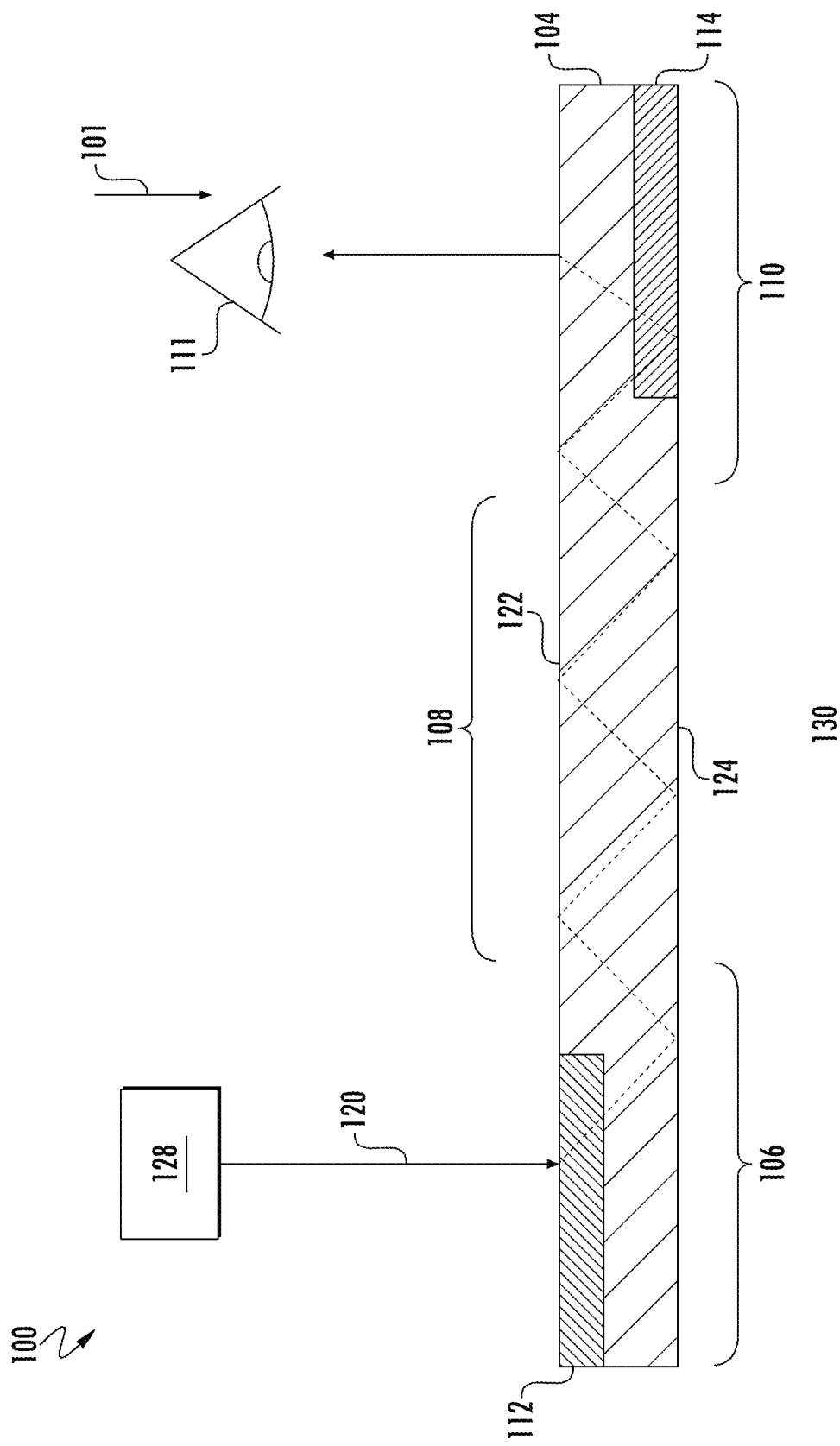
FIG. 1 is a schematic, cross-sectional view of a display apparatus according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods in accordance with the present disclosure will now be described more fully hereinafter with reference to the accompanying drawings, where embodiments of the methods are shown. The methods may be embodied in many different forms and are not to be construed as being limited to the embodiments set forth herein. Instead, these embodiments are provided so the disclosure will be thorough and complete, and will fully convey the scope of the system and method to those skilled in the art.

FIG. 1 is a schematic, cross-sectional view of a waveguide 104 implemented in a display apparatus 100. The display apparatus 100 may be configured for augmented, virtual, and mixed or merged reality applications as well as other display applications, for example, hand held display devices.

The display apparatus 100 uses the waveguide 104 for transparent viewing of an ambient environment 130 through the waveguide 104, such as for a user viewing the environment 130 from a user perspective 101. When implemented in the display apparatus 100, a first surface 122 of the waveguide 104 is disposed adjacent to, and facing, a user's eye 111. A second surface 124 of the waveguide 104 is disposed opposite the first surface 122 and adjacent to and facing the ambient environment 130. Although illustrated as being planar, the waveguide 104 may be curved, depending upon the desired application.

The display apparatus 100 further includes an image microdisplay 128 to direct light 120 of a generated, virtual image into the waveguide 104. The light 120 of the virtual image is propagated in the waveguide 104. Generally, the waveguide 104 includes an input coupling region 106, a waveguide region 108, and an output coupling region 110. The input coupling region 106 receives light 120 (a virtual image) from the image microdisplay 128 and the light 120 travels through the waveguide region 108 to the output coupling region 110 where the user's perspective 101 and field of view enable visualization of a virtual image overlaid on the ambient environment 130. The image microdisplay 128 is a high resolution display generator, such as a liquid crystal on silicon microdisplay operable to project the light of the virtual image into the waveguide 104.

The waveguide 104 includes input grating structures 112 and output grating structures 114. The input grating structures 112 are formed on the waveguide 104 in an area corresponding to the input coupling region 106. The output grating structure 114 are formed on the waveguide 104 in an area corresponding to the output coupling region 110. The input grating structures 112 and output grating structure 114 influence light propagation within the waveguide 104. For example, the input grating structure 112 couples in light from the image microdisplay 128 and the output grating structure couples out light to the user's eye 111.

For example, the input grating structures 112 influence the field of view of a virtual image displayed at the user's eye 111. The output grating structures 114 influence the amount of light 120 collected and outcoupled from the waveguide 104. In addition, the output grating structures 114 modulate the field of view of a virtual image from a user's perspective 101 and increase the viewing angle a user can view the virtual image from the image microdisplay 128. In another example, a grating structure (not shown) is also formed in the waveguide region 108 between the input coupling region 106 and the output coupling region 110. Additionally, multiple waveguides 104, each with desired grating structures formed therein, can be used to form the display apparatus 100.

Figure 2A:
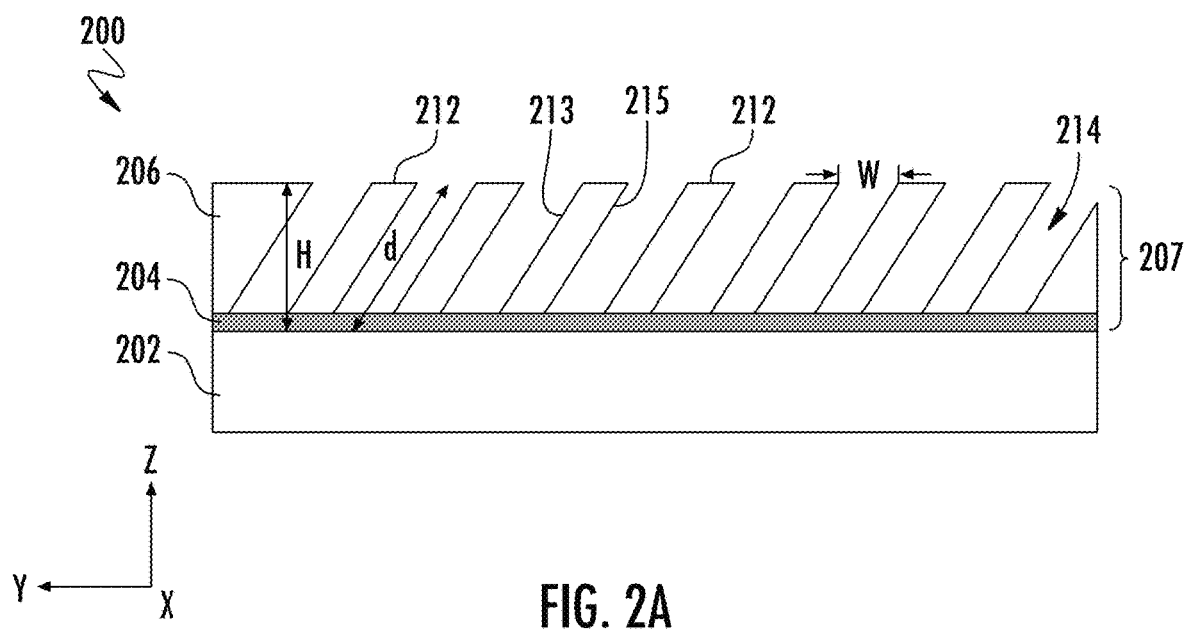
FIG. 2A depicts a side cross sectional view of an optical grating component according to embodiments of the disclosure.
Figure 2B:
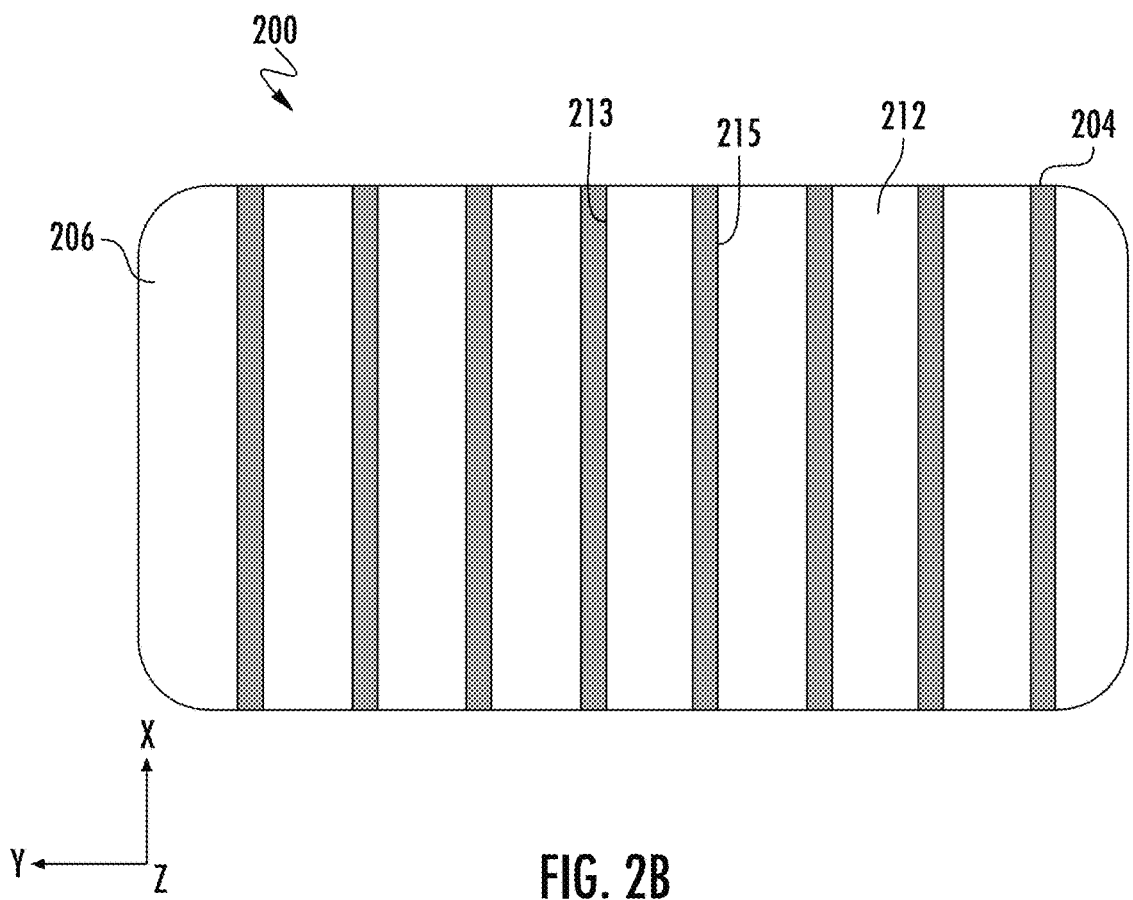
FIG. 2B depicts a top plan view of the optical grating component of FIG. 1A according to embodiments of the disclosure.

FIG. 2A depicts a side cross sectional view of an optical grating component 200, according to embodiments of the disclosure. FIG. 2B depicts a top plan view of the optical grating component 200. The optical grating component 200 may be used as an optical grating to be placed on an eyeglass or formed integrally in the eyeglass in accordance with various embodiments of the disclosure. The optical grating component 200 includes a substrate 202, and an optical grating 206 disposed on the substrate 202. The optical grating 206 may be the same or similar to the input grating structure 112 and/or the output grating structure 114 of FIG. 1. In some embodiments, the substrate 202 is an optically transparent material, such as a known glass. In some embodiments, the substrate 202 is silicon. In the latter case, the substrate 202 is silicon, and another process is used to transfer grating patterns to a film on the surface of another optical substrate, such as glass or quartz. The embodiments are not limited in this context. The optical grating 206 may be disposed in an optical grating layer 207, as described further below. In the non-limiting embodiment of FIG. 2A and FIG. 2B, the optical grating component 200 further includes an etch stop layer 204, disposed between the substrate 202 and optical grating layer 207. According to some embodiments of the disclosure, the optical grating layer 207 may be an optically transparent material, such as silicon oxide, silicon nitride, glass, $TiO_2$, or other material.

According to some embodiments of the disclosure, the optical grating 206 may comprise a grating height H in the range of 100 nm to 1000 nm. As such, the optical grating 206 may be appropriate for use in an eyepiece of an AR &VR apparatus. Embodiments herein are not limited in this context. In accordance with some embodiments, the etch stop layer 204 may be an optically transparent material and may have a thickness of 10 nm to 100 nm. The embodiments are not limited in this context. Examples of a suitable material for the etch stop layer 204 include SiN, $SiO_2$, TiN, SiC, and other materials. In embodiments where the optical grating 206 is to be applied to or incorporated in an eyepiece of an eyeglass, an especially appropriate material is an optically transparent material. In embodiments where the optical grating component 200 forms a master for fabricating optical gratings for an eyepiece, the etch stop layer 204 need not be optically transparent. Moreover, the etch stop layer 204 may be omitted in some embodiments.

As further shown in FIG. 2A, the optical grating 206 may comprise a plurality of angled structures, shown as angled components or structures 212, disposed at a non-zero angle of inclination with respect to a perpendicular to a plane (e.g., x-y plane) of the substrate 202. The angled structures 212 may be included within one or more fields of slanted gratings, the slanted grating together forming "microlenses." In the example of FIG. 2A, define a uniform height along the direction parallel to the Y-axis of the Cartesian coordinate system shown, where the first direction (y-axis) is parallel to the plane of the substrate 202, in this case the x-y plane. In other embodiments, the angled structures 212 may define a variable height along the direction parallel to the y-axis. The plurality of trenches 214 may be disposed at a non-zero angle of inclination with respect to a perpendicular to a plane, such as a top surface of the substrate 202 or a top surface of optical grating layer 207. As will be described in greater detail below, the depth 'd' and/or the width 'w' of one or more trenches of the plurality of trenches 214 may vary due to the presence of a mask layer provided over the optical grating 206 prior to etching.

In some embodiments, the width of the optical grating 206 along the Y-direction may be on the order of several millimeters to several centimeters, while the grating height H may be on the order of 1 micrometer or less. Accordingly, the variation in grating height H may range on the order of several hundred nanometers or less. An example of a smooth variation in grating height H or depth d is where a change in grating height H or depth d between adjacent lines of a grating is less than 10%, less than 5%, or less than 1%. The embodiments are not limited in this context. Thus, in an eyepiece, the grating height H may vary continuously and in a non-abrupt fashion in a given direction along the surface of the eyepiece over a distance of, for example, millimeters to centimeters. More particularly, a change in grating height H of 50% over a 5 mm distance may entail changing the grating height H continuously over approximately $5 \times 10^3$ lines having a pitch of one micrometer. The change entails an average change in relative height of adjacent lines of $0.5/5 \times 10^4$ or approximately 0.01%.

Figure 3A:
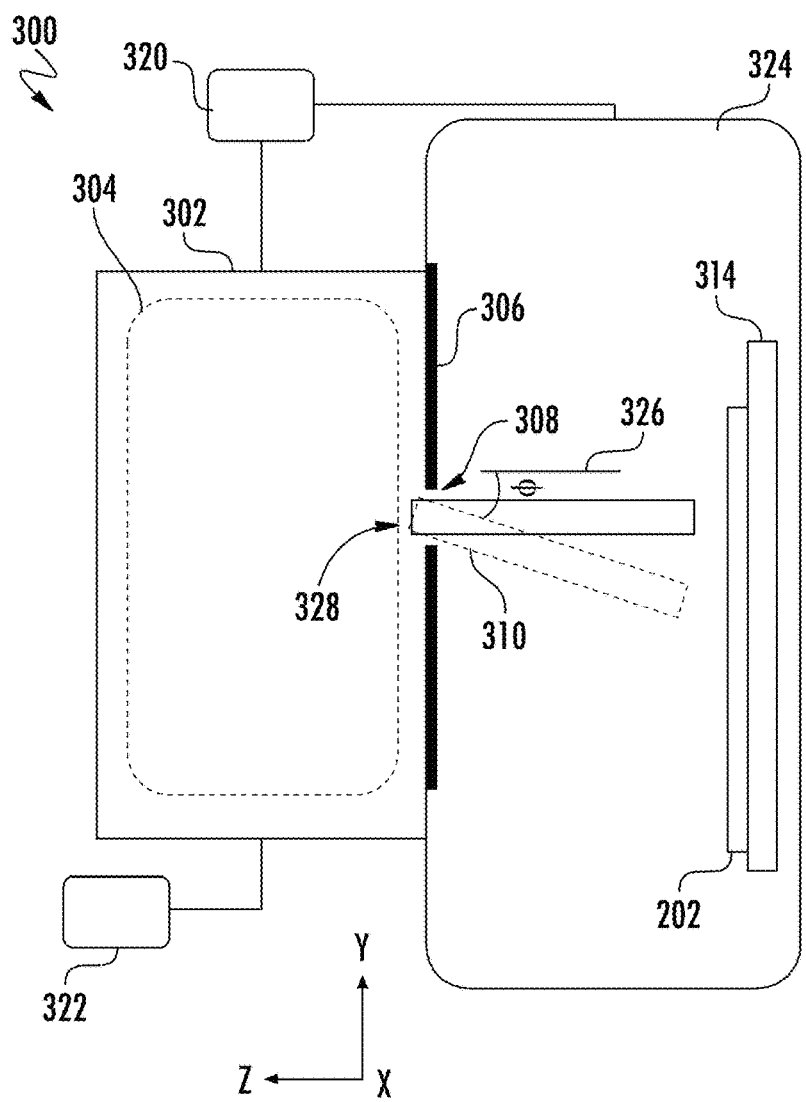
FIG. 3A shows a processing apparatus, depicted in schematic form, in accordance with embodiments of the present disclosure.

Turning now to FIG. 3A, there is shown a processing apparatus 300, depicted in schematic form. The processing apparatus 300 represents a processing apparatus for etching portions of a substrate, or depositing on a substrate, to generate, for example, the optical gratings of the present embodiments. The processing apparatus 300 may be a plasma based processing system having a plasma chamber 302 for generating a plasma 304 therein by any convenient method as known in the art. An extraction plate 306 may be provided as shown, having an extraction aperture 308, where a non-uniform etching or non-uniform deposition may be performed to reactively etch or deposit an optical grating layer 207 (FIGS. 2A-2B). A substrate 202, including, for example, the aforementioned optical grating structure, is disposed in the process chamber 324. A substrate plane of the substrate 202 is represented by the X-Y plane of the Cartesian coordinate system shown, while a perpendicular to the plane of the substrate 202 lies along the Z-axis (Z-direction).

As further shown in FIG. 3A, an ion beam 310 may be extracted when a voltage difference is applied using bias supply 320 between the plasma chamber 302 and substrate 202, or substrate platen 314, as in known systems. The bias supply 320 may be coupled to the process chamber 324, for example, where the process chamber 324 and substrate 202 are held at the same potential.

According to various embodiments, the ion beam 310 may be extracted along the perpendicular 326 or may be extracted at a non-zero angle of incidence, shown as ϕ, with respect to the perpendicular 326.

The trajectories of ions within the ion beam 310 may be mutually parallel to one another or may lie within a narrow angular spread range, such as within 10 degrees of one another or less. In other embodiments, as will be discussed below, the trajectory of ions within the ion beam 310 may converge or diverge from one another, for example, in a fan shape. Thus, the value of ϕ may represent an average value of incidence angle where the individually trajectories vary up to several degrees from the average value. In various embodiments, the ion beam 310 may be extracted as a continuous beam or as a pulsed ion beam as in known systems. For example, the bias supply 320 may be configured to supply a voltage difference between the plasma chamber 302 and the process chamber 324, as a pulsed DC voltage, where the voltage, pulse frequency, and duty cycle of the pulsed voltage may be independently adjusted from one another.

In various embodiments, gas, such as reactive gas, may be supplied by the source 322 to plasma chamber 302. The plasma 304 may generate various etching species or depositing species, depending upon the exact composition of species provided to the plasma chamber 302.

Figure 3B:
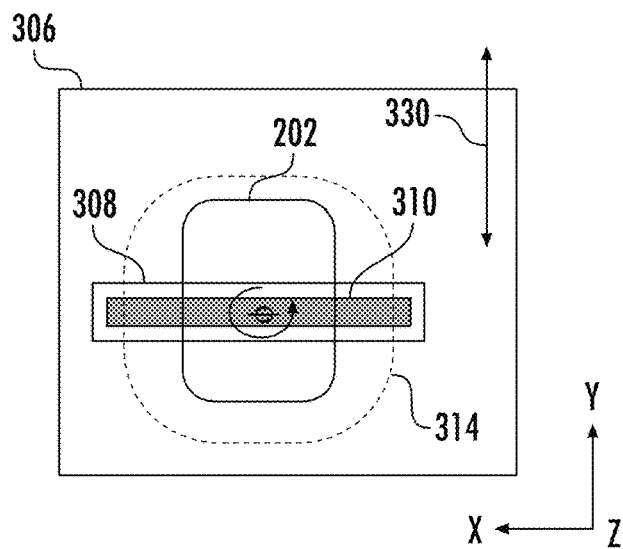
FIG. 3B shows an extraction plate component and substrate in top plan view in accordance with embodiments of the present disclosure.

In various embodiments, the ion beam 310 may be provided as a ribbon reactive ion beam having a long axis extending along the X-direction of the Cartesian coordinate system shown in FIG. 3B. By scanning a substrate platen 314 including substrate 202 with respect to the extraction aperture 308, and thus with respect to the ion beam 310 along the scan direction 330, the ion beam 310 may etch the substrate 202 or deposit upon the substrate 202. The ion beam 310 may be composed of any convenient gas mixture, including inert gas, reactive gas, and may be provided in conjunction with other gaseous species in some embodiments. In particular embodiments, the ion beam 210 and other reactive species may be provided as an etch recipe to the substrate 202 so as to perform a directed reactive ion etching of a layer, such as the optical grating layer 307. Such an etch recipe may use known reactive ion etch chemistries for etching materials such as oxide or other material, as known in the art. In other embodiments, the ion beam 310 may be formed of inert species where the ion beam 310 is provided to etch the substrate 202 or more particularly, the optical grating layer 207, by physical sputtering, as the substrate 202 is scanned with respect to ion beam 310.

In the example of FIG. 3B, the ion beam 310 is provided as a ribbon reactive ion beam extending to a beam width along the X-direction, where the beam width is adequate to expose an entire width of the substrate 202, even at the widest part along the X-direction. Exemplary beam widths may be in the range of 10 cm, 20 cm, 30 cm, or more while exemplary beam lengths along the Y-direction may be in the range of 2 mm, 3 mm, 5 mm, 10 mm, or 20 mm. The embodiments are not limited in this context.

Notably, the scan direction 330 may represent the scanning of substrate 202 in two opposing (180 degrees) directions along the Y-direction, or just a scan toward the left or a scan toward the right. As shown in FIG. 3B, the long axis of ion beam 310 extends along the X-direction, perpendicularly to the scan direction 330. Accordingly, an entirety of the substrate 202 may be exposed to the ion beam 310 when scanning of the substrate 202 takes place along a scan direction 330 to an adequate length from a left side to right side of substrate 202.

The grating features, such as the angled structures 212 of FIGS. 2A-2B, may be accomplished by scanning the substrate 202 with respect to the ion beam 310 using a processing recipe. In brief, the processing recipe may entail varying at least one process parameter of a set of process parameters, having the effect of changing, e.g., the etch rate or deposition rate caused by the ion beam 310 during scanning of the substrate 202. Such process parameters may include the scan rate of the substrate 202, the ion energy of the ion beam 310, duty cycle of the ion beam 310 when provided as a pulsed ion beam, the spread angle of the ion beam 310, and rotational position of the substrate 202. In at least some embodiments herein, the processing recipe may further include the material(s) of the optical grating layer 207, and the chemistry of the etching ions of the ion beam 310. In yet other embodiments, the processing recipe may include starting geometry of the optical grating layer 207, including dimensions and aspect ratios. The embodiments are not limited in this context.

Figure 4A:
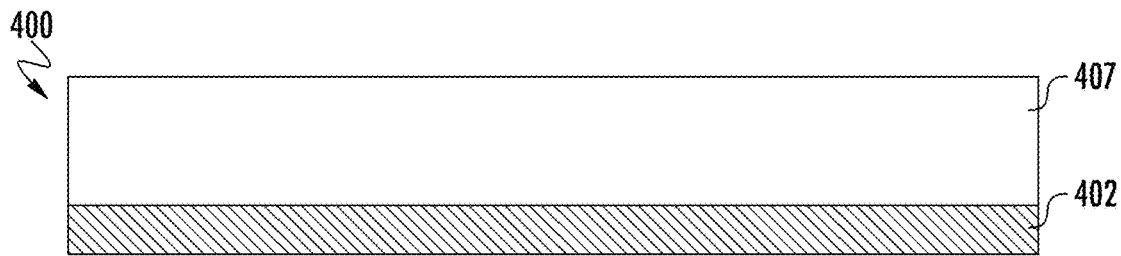
FIGS. 4A-D are side cross-sectional views of angled structures as formed in an optical grating layer in accordance with embodiments of the present disclosure.

FIGS. 4A-4D demonstrate a method for forming a diffracted optical element 400 according to embodiments of the present disclosure. As shown in FIG. 4A, an optical grating layer 407 may be formed over a substrate 402. Although not shown, in some embodiments, an etch stop layer may be provided between the substrate 402 and the optical grating layer 407. The substrate 402 may be made from an optically transparent material, such as silicon. When present, the etch stop layer may be formed, for example, by a chemical vapor deposition (CVD) process, a physical vapor deposition (PVD) process, or a spin-on process. The etch stop layer is formed from a material, such as titanium nitride or tantalum nitride, among others, resistant to an etching process.

The grating layer 407 may be formed from an optically transparent material. In one example, the grating layer 407 is formed from a silicon-based material, such as silicon nitride or silicon oxide, or a titanium-based material, such as titanium oxide. The material of the grating layer 407 has a high refractive index, such as approximately 1.3 or higher, like 1.5, or even higher. Generally, the grating layer 407 has a thickness less than approximately 1 micrometer, such as between approximately 150 nm and 700 nm.

Figure 4B:
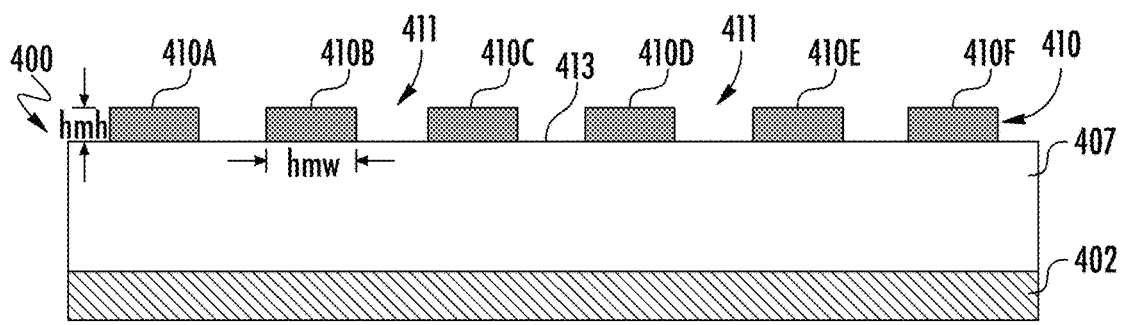

As shown in FIG. 4B, a patterned hardmask 410 may be formed over the optical grating layer 407. In some embodiments, the patterned hardmask (hereinafter "hardmask") 410 is formed from a photoresist stack (not shown), wherein a hardmask layer is conformally formed over the grating layer 407. The hardmask layer is, for example, formed from titanium nitride using a chemical vapor deposition process. As shown, the hardmask 410 is formed as a plurality of hardmask elements 410A-F separated from one another by a gap 411. Each of the gaps 411 may be formed using an etch process selective to a top surface 413 of the optical grating layer 407. In some embodiments, the plurality of hardmask elements 410A-F is formed by etching a photoresist stack. In some embodiments, each of the plurality of hardmask elements 410A-F has a same height 'hmh' and/or width 'hmw'. In other embodiments, one or more of the plurality of hardmask elements 410A-F has a different or non-uniform height and/or thickness.

Figure 4C:
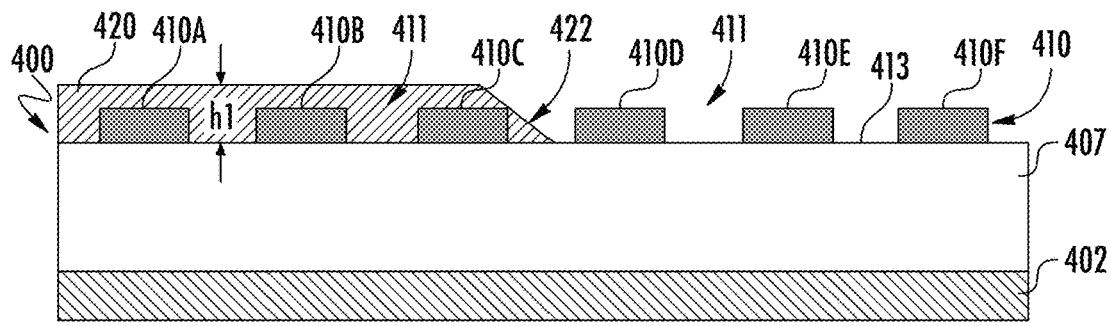

As shown in FIG. 4C, a mask 420 may then be formed over the optical grating layer 407 and the hardmask 410. In some embodiments, the mask 420 is a "soft" mask formed over just a portion of the optical grating layer 407 and the hardmask 410. For example, the mask 420 may be formed over the hardmask elements 410A-410C, while the hardmask elements 410D-410F remain uncovered and exposed. In non-limiting embodiments, the mask 420 may be a photoresist-type material formed over the diffracted optical element 400 using 3-D printing. In other embodiments, the mask 420 may be "imaged" during photolithography, or formed by subtractive methods, such as ion etching, reactive or sputter, and laser oblation. For example, the entire etch depth profiling or a portion thereof may be achieved via a patterned mask process. In this case, the angled etch may be a uniform process. The mask 420 may have a uniform height 'h1' or a variable height. For example, the mask 420 may include one or more sloped sections 422. The shape of the sloped section 422 in the mask 420 may be transferred to the shape of the bottom of the trenches, as will be described in greater detail below.

In some embodiments, the mask 420 may be formed over the optical grating layer 407 and the hardmask 410 by first shaping the mask 420, and then transferring the shape to the diffracted optical element 400. By shaping the mask 420, precision may be improved. Furthermore, in some embodiments, the mask 420 may then be patterned, e.g., using a subtractive technique such as etching.

Figure 4D:
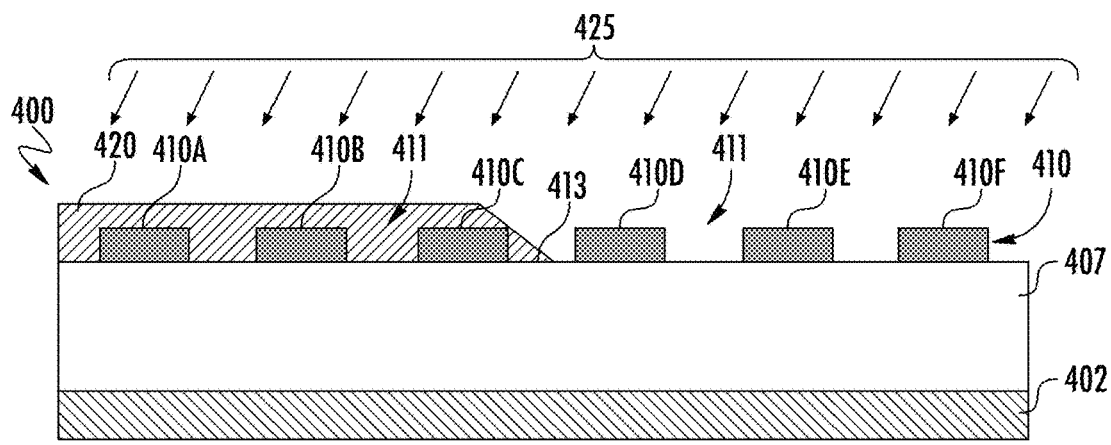

As shown in FIG. 4D, the diffracted optical element 400 is then etched 425. In some embodiments, the etch 425 is an angled ion etch, wherein the angled ion etch is performed by a reactive ion beam. The substrate may be scanned along a scan direction with respect to the reactive ion beam. During the etch process, the hardmask 410 functions as a pattern guide for formation of the slanted grating structures. In examples where the mask 420 has also been patterned, the mask 420 also acts as a pattern guide for formation of the slanted grating structures.

Figure 5:
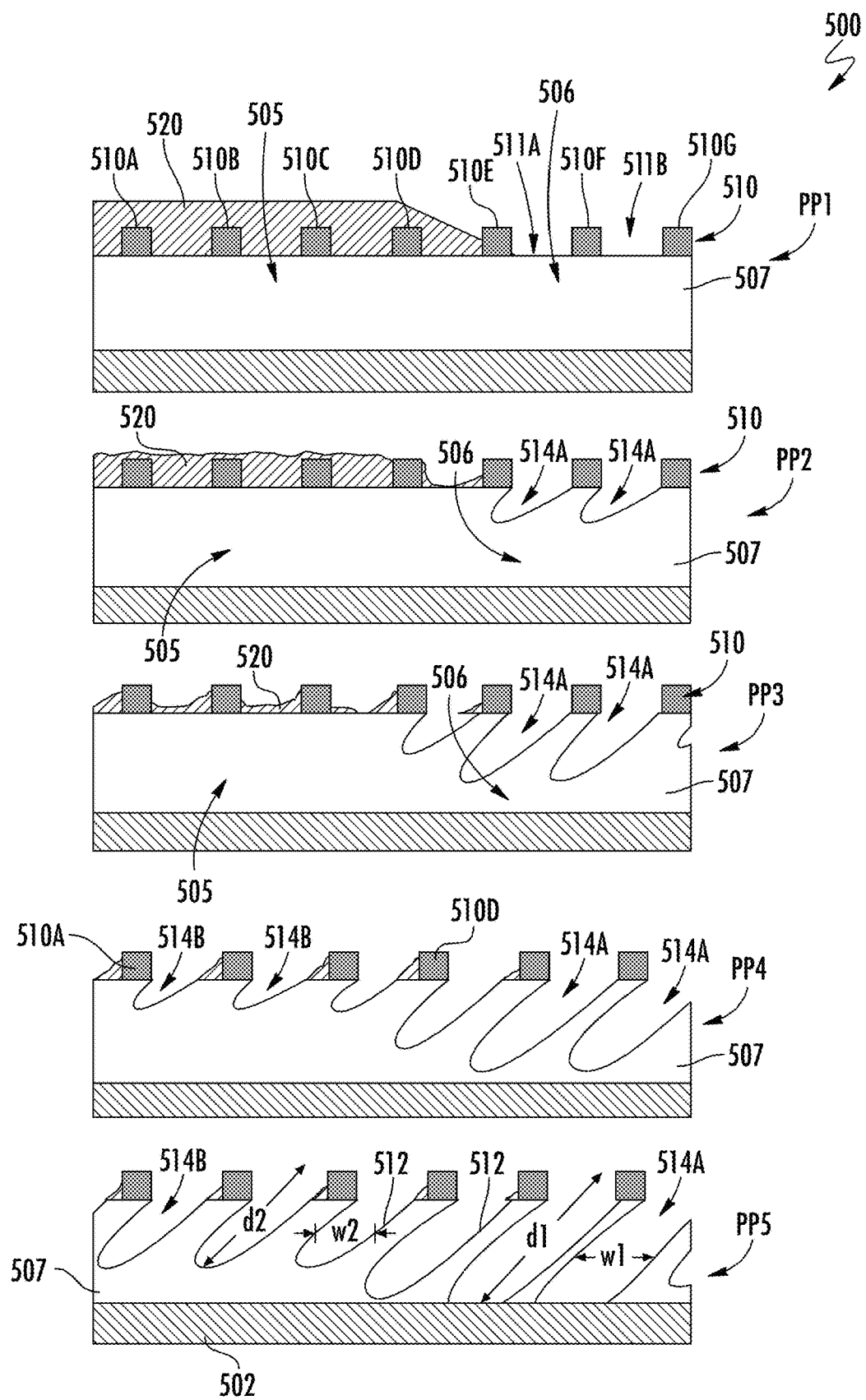
FIG. 5 shows is an etch process to form an optical grating according to embodiments of the present disclosure.

Turning now to FIG. 5, a diffracted optical element 500 over a series of etch cycles according to embodiments of the present disclosure will be described. At process point (PP) 1, the mask 520 is formed over just a first portion 505 of the optical grating layer 507 and the hardmask 510. As shown, the hardmask elements 510E-510G above a second portion 506 of the optical grating layer 507 remain exposed. Furthermore, gaps 511A and 511B are left uncovered by the mask 520. At PP 2, the etch process begins, causing a first set of trenches 514A to be formed in the second portion 506 of the optical grating layer 507. Because the gaps 511A and 511B are left uncovered by the mask 520, the etching is permitted to more quickly impact the optical grating layer 507 in those areas. Although, in those areas of the optical grating layer 507 covered by the mask 520, no trench formation has begun at PP 2. Although non-limiting, the ratio of etch selectivity between the substrate 502, the hardmask 510 and the mask 520 is approximately 1:20:2.

As shown at PP 3, as the etch process continues, the first set of trenches 514A deepen in the second portion 506 of the optical grating layer 507, while the mask 520 is recessed in an area above the first portion 505 of the optical grating layer 507. At PP 4, a second set of trenches 514B is formed into the first portion 505 of the optical grating layer 507, between each of the plurality of hardmask elements 510A-510D. The etching continues at PP5 until the first set of trenches 514A reach the substrate 502, thus forming each of the plurality of angled structures 512 from the optical grating layer 507. As shown, the second set of trenches 514B does not extend to the substrate 502. Said another way, a first depth 'd1' of one or more trenches of the first set of trenches 514A may be greater than a second depth 'd2' of one or more trenches of the second set of trenches 514B. Furthermore, a first width 'w1' of one or more trenches of the first set of trenches 514A may be greater than a second width 'w2' of one or more trenches of the second set of trenches 514B. The presence of the mask 520 in PP1-PP3 causes the etch process to impact the second portion 506 of the optical grating layer 507 before impacting the first portion 505 of the optical grating layer, resulting in more shallow and/or narrow trenches in the first portion 505.

By controlling the shape of each of the angled structures 512, changes in the diffractions of different wavelengths (i.e., different colors) may be controlled to improve the image quality. The optical efficiency (i.e., projection of desired wavelengths to a user's perspective) is greatly improved due to the increased control provided by the angled structures 512. Further, the projection of undesired wavelengths is reduced. thus increasing the clarity and quality of the projected image.

Figure 6:
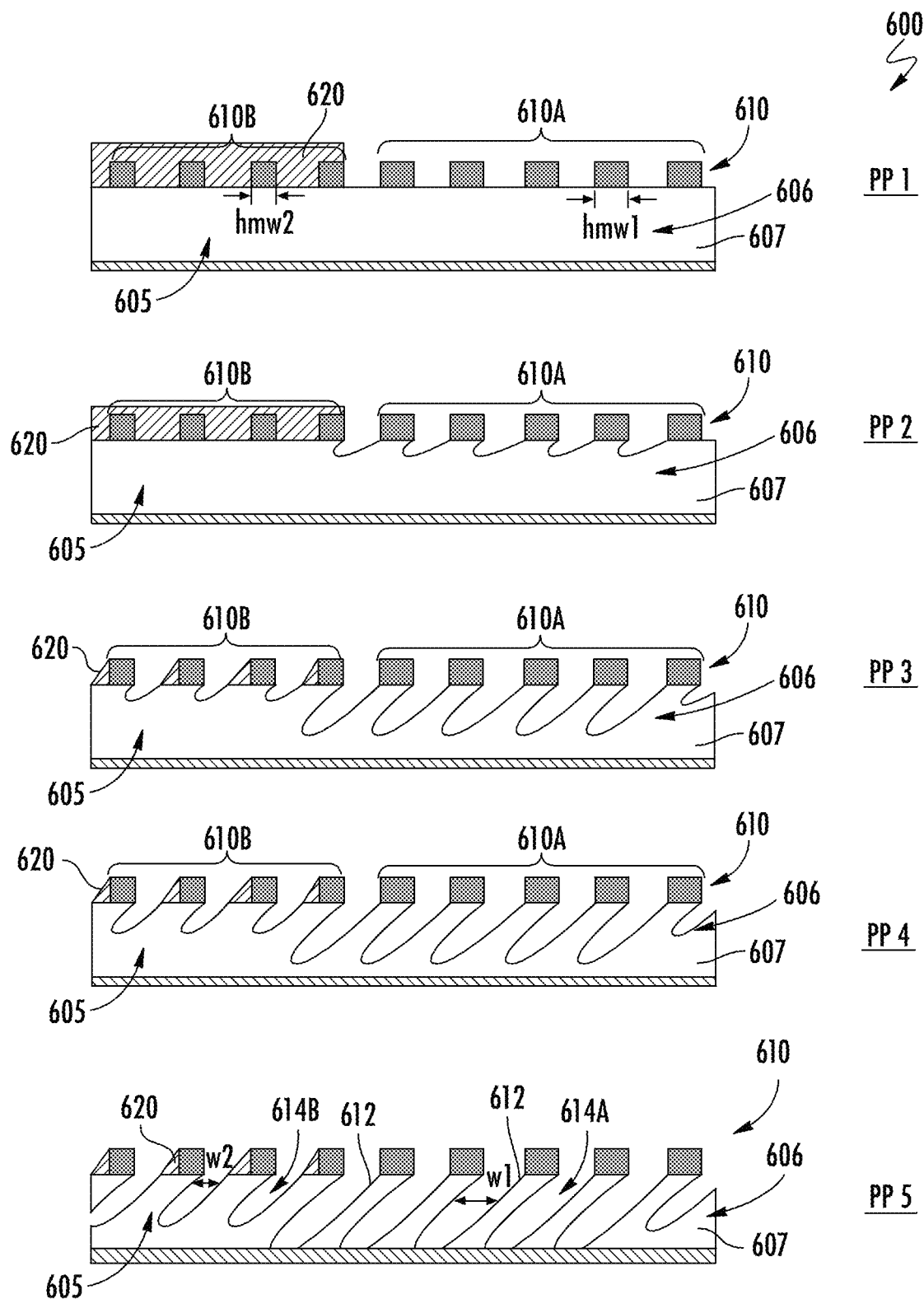
FIG. 6 shows is an etch process to form an optical grating according to embodiments of the present disclosure.

Turning now to FIG. 6, a diffracted optical element 600 over a series of etch cycles according to embodiments of the present disclosure will be described. The diffracted optical element 600 is similar to the diffracted optical element 500 of FIG. 5. As such, not all details of the diffracted optical element 600 will be described for the sake of brevity. At PP 1 the hardmask 610 includes a first subset of hardmask elements 610A formed adjacent a second subset of hardmask elements 610B. The mask 620 is formed over just the first portion 605 of the optical grating layer 607 and over just the second subset of hardmask elements 610B. As shown, each of the first subset of hardmask elements 610A has a first hardmask width 'hmw1' and each of the second subset of hardmask elements 610B has a second hardmask width 'hmw2'. In this embodiment, hmw1 is greater than hmw2. In other embodiments, more than two different hardmask widths may be present. By making hmw1>hmw2, a first width 'w1' of one or more trenches of the first set of trenches 614A may be approximately equal to a second width 'w2' of one or more trenches of the second set of trenches 614B, as shown by the diffracted optical element 600 at PP 6. Said another way, the width and shape of the plurality of angled structures 612 may be more uniform. The variable hardmask 610 width compensates for loss of grating width.

Figure 7:
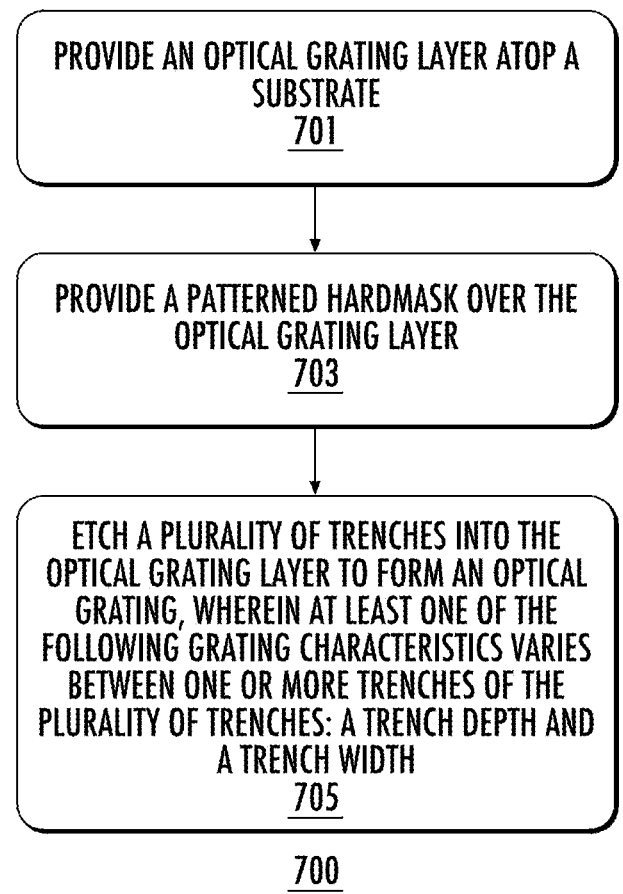
FIG. 7 depicts a process flow in accordance with embodiments of the disclosure.

Turning now to FIG. 7, a method 700 for forming an optical grating component according to embodiments of the present disclosure will be described in greater detail. As shown, at block 701, the method 700 may include providing an optical grating layer atop a substrate. At block 703, the method 700 may include providing a patterned hardmask over the optical grating layer. In some embodiments, the patterned hardmask is a plurality of hardmask elements each separated from one another by a gap, wherein a first hardmask element of the plurality of the hardmask elements has a different width than a width of a second hardmask element of the plurality of hardmask elements. In some embodiments, the method includes forming a first subset of the plurality of hardmask elements adjacent a second subset of the plurality of hardmask elements, wherein each of the first subset of the plurality of hardmask elements has a first width. Furthermore, each of the second subset of the plurality of hardmask elements may have a second width, wherein the first width is greater than the second width.

At block 705, the method 700 may include forming a mask over just a portion of the optical grating layer and the patterned hardmask. In some embodiments, the mask is a soft mask more easily etched than the hardmask. Said another way, the hardmask is more resistant to an etch that the mask. In some embodiments, the mask may be formed over just a subset of hardmask elements, while another subset of hardmask elements remains uncovered and exposed. In non-limiting embodiments, the mask may be a photoresist-type material formed over the diffracted optical element using 3-D printing. In some embodiments, the mask may then be patterned to form a plurality of hardmask elements each separated from one another by a gap.

At block 707, the method 700 may include etching a plurality of trenches into the optical grating layer to form an optical grating, wherein at least one of the following grating characteristics varies between one or more trenches of the plurality of trenches: a trench depth and a trench width. In some embodiments, a first width of a first trench of the plurality of trenches is different than a second width of a second trench of the plurality of trenches. In some embodiments, the plurality of trenches may be etched to form a third trench having a different width than a width of: the first trench or the second trench. In some embodiments, the mask layer may be patterned, or partially patterned, prior to the etching process. In other embodiments, the mask and the optical grating layer between each of the exposed hardmask elements may begin to be recessed at the same time.

Figure 8:
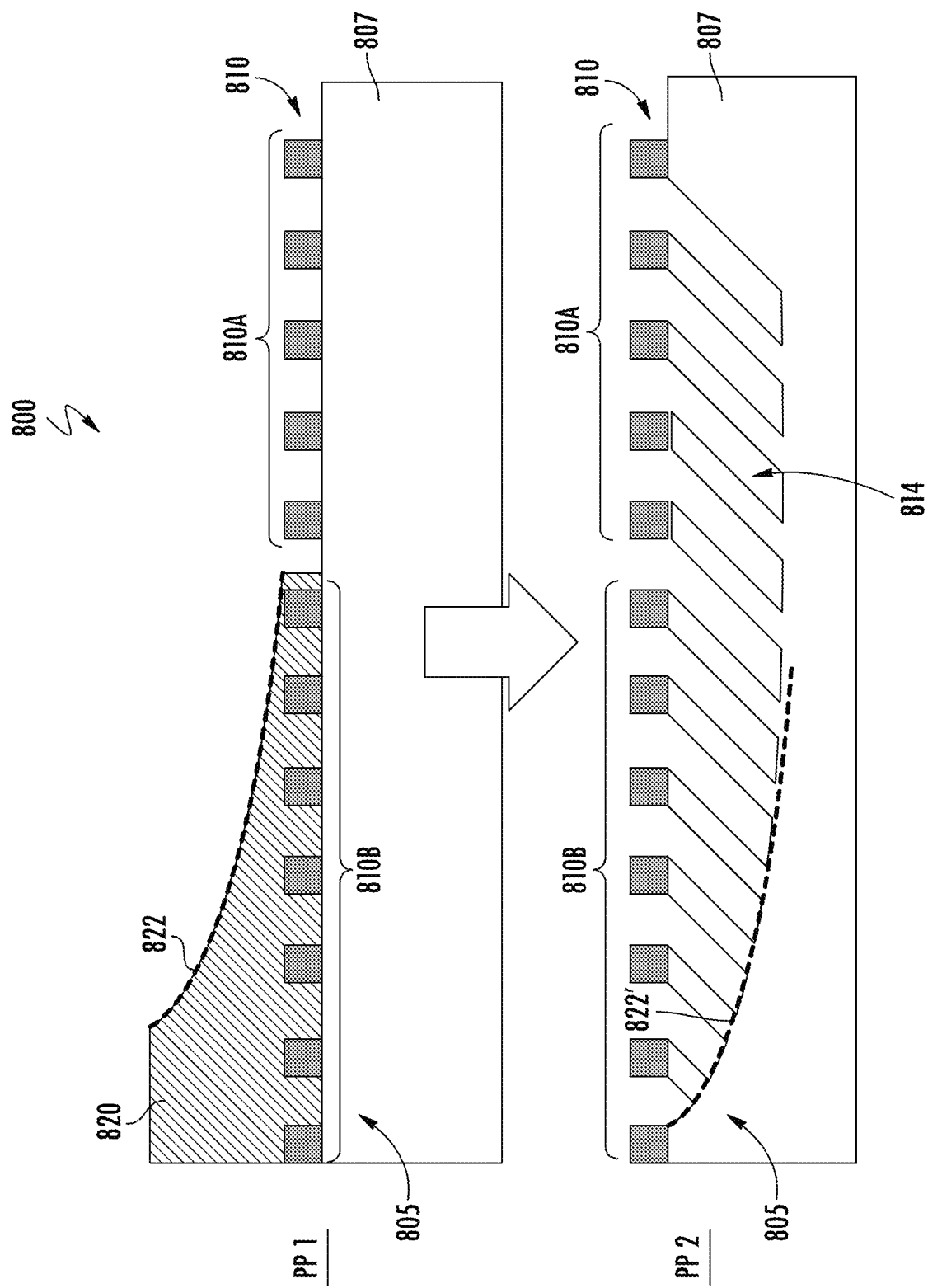
FIG. 8 depicts a diffracted optical element over a series of etch cycles according to embodiments of the present disclosure.

Turning now to FIG. 8, a diffracted optical element 800 over a series of etch cycles according to embodiments of the present disclosure will be described. The diffracted optical element 800 is similar to the diffracted optical element 500 of FIG. 5 and the diffracted optical element 600 in FIG. 6. As such, not all details of the diffracted optical element 800 will be described for the sake of brevity. In the embodiment shown, at PP 1 the hardmask 810 includes a first subset of hardmask elements 810A formed adjacent a second subset of hardmask elements 810B. The mask 820 is formed over just the first portion 805 of the optical grating layer 807 and over just the second subset of hardmask elements 810B. As shown, the mask 820 may have a sloped surface profile 822 subsequently transferred (shown as 822') to the shape of the bottom of the trenches 814, for example, as shown in PP2.

Figure 9:
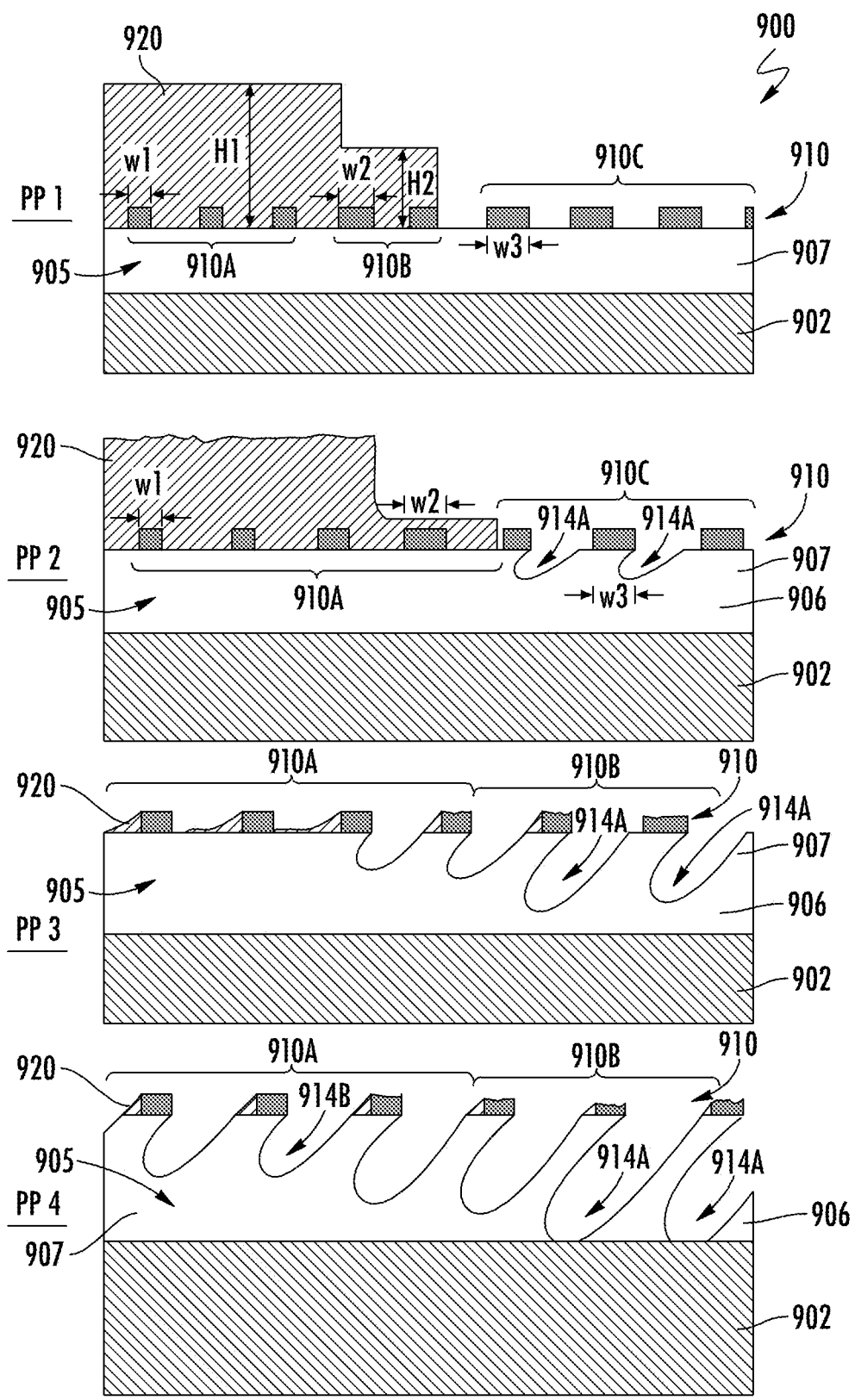
FIG. 9 depicts a diffracted optical element over a series of etch cycles according to embodiments of the present disclosure.

Turning now to FIG. 9, a diffracted optical element 900 over a series of etch cycles according to embodiments of the present disclosure will be described. The diffracted optical element 900 is similar to the diffracted optical elements 500, 600, and 800 described above. As such, not all details of the diffracted optical element 900 will be described for the sake of brevity. In the embodiment shown, at PP 1, the mask 920 is provided over just the first portion 905 of the optical grating layer 907 and over just a first subset 910A and a second subset 910B of the hardmask elements 910. The mask 920 may not be formed over a third subset 910C of the hardmask elements 910. Although, in other embodiments, the mask 920 may extend over both the first portion 905 and the second portion 906 of the optical grating layer 907.

As shown, the mask 920 may have one or more levels or heights, H1 and H2, as measured from a top surface of the optical grating layer 907. Additionally, the first subset 910A of the hardmask elements 910 may each have a first width w1, the second subset 910B of the hardmask elements 910 may each have a second width w2, and the third subset 910C of the hardmask elements 910 may each have a third width w3. As shown, w3>w2>w1, wherein the width of the hardmask elements 910 is generally proportional to the height of the mask 920. Varying the width of the hardmask elements 910 at the start of processing (e.g., PP 1) result in more uniform-withed angled structures 912 at the end of processing, for example, at PP 4.

In this embodiment, the mask 920 may also be softer than the optical grating layer 907. Making the mask 920 softer than the optical grating layer 907 and the hardmask elements 910 enables a taller layer of the mask 920, in turn enabling more methods to shape the mask 920, such as 3D printing. In other embodiments, the optical grating layer 907 may be softer than the mask 920.

At PP 2, the etch process begins, causing one or more first set of trenches 914A to be formed in the second portion 906 of the optical grating layer 907, between a second subset 910B of the hardmask elements 910. Because the second portion 906 of the optical grating layer 907 is left uncovered by the mask 520, the etching is permitted to more quickly impact the optical grating layer 907 in the second portion

906. Although, in those areas of the optical grating layer 907 covered by the mask 920, no trench formation has begun at PP 2.

As shown at PP 3, as the etch process continues, the first set of trenches 914A deepen in the second portion 906 of the optical grating layer 907, while the mask 920 is recessed in an area above the first portion 905 of the optical grating layer 907. At PP 4, a second set of trenches 914B is formed into the first portion 905 of the optical grating layer 907, between each of the subset 910A of the hardmask elements 910. The etching may continue until the first set of trenches 914A reach the substrate 902, thus forming each of the plurality of angled structures 912 from the optical grating layer 907. As shown, the second set of trenches 914B may not extend to the substrate 902. By controlling the shape of each of the angled structures 912, changes in the diffractions of different wavelengths (i.e., different colors) may be controlled to improve the image quality. The optical efficiency (i.e., projection of desired wavelengths to a user's perspective) is greatly improved due to the increased control provided by the angled structures 912. Further, the projection of undesired wavelengths is reduced thus increasing the clarity and quality of the projected image.

For the sake of convenience and clarity, terms such as "top," "bottom," "upper," "lower," "vertical," "horizontal," "lateral," and "longitudinal" will be used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including although not limited to, for example: chemical vapor deposition (CVD), low-pressure CVD (LPCVD), and plasma-enhanced CVD (PECVD). "Depositing" and/or "deposited" may also include semi-atmosphere CVD (SACVD) and high-density plasma CVD (HDPCVD), rapid thermal CVD (RTCVD), ultra-high vacuum CVD (UHVCVD), limited reaction processing CVD (LRPCVD), and metal-organic CVD (MOCVD). "Depositing" and/or "deposited" may also include sputtering deposition, ion beam deposition, electron beam deposition, laser assisted deposition, thermal oxidation, thermal nitridation, spin-on methods, and physical vapor deposition (PVD). "Depositing" and/or "deposited" may also include atomic layer deposition (ALD), chemical oxidation, molecular beam epitaxy (MBE), plating, evaporation.

In various embodiments, design tools can be provided and configured to create the datasets used to pattern the layers of diffracted optical elements 400, 500, 600, 800, and 900 e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the description, the various features and functionality described herein may be implemented in any given application. Furthermore, the various features and functionality can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

By utilizing the embodiments described herein, a waveguide having slanted grating structures is formed. A first technical advantage of the slanted grating structures of the present embodiments includes improved function of the waveguide by better collecting and directing light passing through the waveguide, thus improving clarity of a projected image. A second technical advantage of the slanted grating structures of the present embodiments includes increased control over the wavelengths of light projected to a desired image plane. The uniformity of the power of light outcoupled by the waveguide is significantly more uniform. A third technical advantage of the slanted grating structures of the present embodiments includes improved manufacturing of a waveguide by eliminating manufacturing processes, such as mechanical polishing, thus reducing damage to layers used to form the waveguide. Further, a fourth technical advantage of the slanted grating structures of the present embodiments includes providing a two dimensional or a three-dimensional shape, enabling use of the waveguide in an increased range of applications.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of forming a diffracted optical element, comprising:
   providing an optical grating layer atop a substrate;
   providing a patterned hardmask over the optical grating layer;
   forming a mask over just a portion of the optical grating layer and the patterned hardmask, wherein the mask is formed directly atop a top surface of the optical grating layer; and
   etching a plurality of trenches into the optical grating layer to form an optical grating, wherein a first depth of a first trench of the plurality of trenches is different than a second depth of a second trench of the plurality of trenches.

2. The method of claim 1, wherein a first width of the first trench of the plurality of trenches is different than a second width of the second trench of the plurality of trenches.

3. The method of claim 1, further comprising patterning the mask prior to etching the plurality of trenches into the optical grating layer.

4. The method of claim 1, wherein the etching comprises performing an angled ion etch.

5. The method of claim 4, wherein the angled ion etch is performed by a reactive ion beam, and wherein the substrate is scanned along a scan direction with respect to the reactive ion beam.

6. The method of claim 1, further comprising forming the patterned hardmask as a plurality of hardmask elements each separated from one another by a gap, wherein a first subset of the plurality of hardmask elements is adjacent a second subset of the plurality of hardmask elements, wherein each of the first subset of the plurality of hardmask elements has a first width, wherein each of the second subset of the plurality of hardmask elements has a second width, and wherein the first width is greater than the second width.

7. The method of claim 6, further comprising forming the mask to include two or more heights relative to a top surface of the optical grating layer.

8. The method of claim 6, further comprising forming the mask over just the second subset of the plurality of hardmask elements.

9. The method of claim 6, wherein the first width of the first trench of the plurality of trenches is approximately equal to the second width of the second trench of the plurality of trenches.

10. A method of forming an optical grating component, comprising:
    providing an optical grating layer atop a substrate;
    providing a patterned hardmask over the optical grating layer;
    forming a mask over just a portion of the optical grating layer and the patterned hardmask, wherein the mask has a lower etch resistance than the patterned hardmask, and wherein the mask is formed directly atop a top surface of the optical grating layer; and
    etching a plurality of trenches into the optical grating layer to form an optical grating, wherein a trench depth varies between one or more trenches of the plurality of trenches.

11. The method of claim 10, wherein the etching comprises performing an angled ion etch.

12. The method of claim 11, wherein the angled ion etch is applied to each of: the optical grating layer, the patterned hardmask, and the mask.

13. The method of claim 11, wherein a first trench of the plurality of trenches formed in the portion of the optical grating layer has a first depth, wherein a second trench of the plurality of trenches formed in a second portion of the optical grating layer has a second depth, and wherein the second depth is greater than the first depth.

14. The method of claim 10, further comprising patterning the mask prior to etching the plurality of trenches into the optical grating layer.

15. The method of claim 10, further comprising forming the patterned hardmask as a plurality of hardmask elements each separated from one another by a gap, wherein a first hardmask element of the plurality of the hardmask elements has a different width than a width of a second hardmask element of the plurality of hardmask elements.

16. The method of claim 15, further comprising forming a first subset of the plurality of hardmask elements adjacent a second subset of the plurality of hardmask elements, wherein each of the first subset of the plurality of hardmask elements has a first width, wherein each of the second subset of the plurality of hardmask elements has a second width, wherein the first width is greater than the second width, wherein each of the plurality of trenches has an approximately uniform width.

17. The method of claim 16, further comprising forming the mask over just the second subset of the plurality of hardmask elements.

18. A method of forming an optical grating component, comprising:
    providing an optical grating layer atop a substrate;
    providing a patterned hardmask over the optical grating layer;
    forming a mask over just a portion of the optical grating layer and the patterned hardmask, and wherein the mask is formed directly atop a top surface of the optical grating layer; and
    forming a plurality of trenches in the optical grating layer by etching the optical grating layer, the patterned hardmask, and the mask, wherein at least one of the following grating characteristics varies between one or more trenches of the plurality of trenches: a trench depth and a trench width.

19. The method of claim 18, further comprising:
    forming a first trench of the plurality of trenches in the portion of the optical grating layer to a first depth; and
    forming a second trench of the plurality of trenches in a second portion of the optical grating layer to a second depth, wherein the second depth is greater than the first depth.

20. The method of claim 18, further comprising forming the patterned hardmask as a plurality of hardmask elements each separated from one another by a gap, wherein a first hardmask element of the plurality of the hardmask elements has a different width than a width of a second hardmask element of the plurality of hardmask elements.

* * * * *